United States Patent
Hoang

(10) Patent No.: US 6,750,712 B1
(45) Date of Patent: Jun. 15, 2004

(54) METHOD AND APPARATUS FOR VOLTAGE CLAMPING IN FEEDBACK AMPLIFIERS USING RESISTORS

(75) Inventor: Chinh L. Hoang, San Diego, CA (US)

(73) Assignee: Artisan Components Inc., Sunnyvale, CA (US)

( * ) Notice: Subject to any disclaimer, the term of this patent is extended or adjusted under 35 U.S.C. 154(b) by 39 days.

(21) Appl. No.: 10/170,526

(22) Filed: Jun. 12, 2002

Related U.S. Application Data

(60) Provisional application No. 60/298,456, filed on Jun. 14, 2001.

(51) Int. Cl.$^7$ .................................................. H03F 3/45
(52) U.S. Cl. ........................................ 330/252; 330/260
(58) Field of Search ........................... 330/69, 252, 258, 330/260; 327/309

(56) References Cited

U.S. PATENT DOCUMENTS

| | | | | |
|---|---|---|---|---|
| 4,161,693 A | * | 7/1979 | Carlson | .................. 330/258 X |
| 4,437,123 A | | 3/1984 | Harlan | ........................ 358/166 |
| 4,473,804 A | | 9/1984 | Wahlquist | .................... 330/255 |
| 5,955,918 A | | 9/1999 | Uno | ............................... 330/9 |
| 6,028,464 A | * | 2/2000 | Bremner | ..................... 327/309 |

* cited by examiner

Primary Examiner—Steven J. Mottola
(74) Attorney, Agent, or Firm—Pillsbury Winthrop LLP

(57) ABSTRACT

A data signaling apparatus includes a differential amplifier for providing an amplified differential output on a pair of outputs in response to a differential signal provided on a pair of inputs, and a clamping resistor between the pair of inputs. The clamping resistor acts to effectively reduce the swing in differential inputs, thereby allowing high gain that does not result in problematic differential outputs. Further, since the resistor is operative for all voltage ranges, it is useful in small signal applications where diodes cannot be used or are too difficult to implement. A data signaling method includes receiving a differential signal on a pair of inputs, reducing the magnitude of the differential signal by a scale factor using a clamping resistor across the pair of inputs, and providing an amplified differential output on a pair of outputs in response to the scaled differential signal provided on the pair of inputs.

23 Claims, 4 Drawing Sheets

METHOD AND APPARATUS FOR VOLTAGE CLAMPING IN FEEDBACK AMPLIFIERS USING RESISTORS

CROSS-REFERENCE TO RELATED APPLICATIONS

The present application is based on, and claims priority from, U.S. provisional application No. 60/298,456, filed Jun. 14, 2001 now abandoned, commonly owned by the present assignee, the contents of which are incorporated herein by reference.

FIELD OF THE INVENTION

The present invention relates generally to data signaling devices, and more particularly, to methods and apparatuses for optimizing gain in differential feedback amplifiers using clamping resistors.

BACKGROUND OF THE INVENTION

Differential feedback amplifiers are used in a variety of high-gain high-speed a applications. FIG. 1 illustrates an example application in optical communications where conventional differential feedback amplifiers 102 are used to implement a limiting amplifier 110 that amplifies the output of a trans-impedance amplifier 104, the trans-imnpedance amplifier providing a differential voltage output in correspondence with the current output of a photodiode 106, for example. The output of the limiting amplifier can be a differential data signal representing a received optical data signal that conforms with signaling standards such as LVDS or CML, for example. Such an output can then be supplied to other electronic circuits for further processing, for example.

In these and other applications for differential feedback amplifiers 102, particularly high speed applications in excess of 1 Gbps in a limiting amplifier example, it is desired that amplifiers 102 provide high gain so as to insure a rapid change in output in response to a small and high frequency change in received input. However, this usually requires the output of the amplifiers 102 to be clamped so that the high gain does not cause the output to saturate the subsequent stage amplifier(s) 102.

FIG. 2A more fully illustrates an example implementation of differential feedback amplifier 102 in accordance with the prior art. As shown in FIG. 2A, differential inputs IN+ and IN− are provided to transistors Q1 and Q2, respectively, and are used to provide amplified differential outputs OUT+ and OUT−. In this example implementation, the open-loop, small-signal gain $A_v$ is provided by transistors Q1 and Q2, and is controlled by resistors RL. More particularly, the gain $A_v$ is proportional to IBIAS×RL. To complete the correspondence between FIGS. 1 and 2A, buffer transistors QBUF and current sources IOUT are shown for providing the proper levels for VOUT− and VOUT+. However, these components will not be shown in subsequent drawings for clarity of the invention.

In operation, depending on a difference between inputs IN+ or IN−, either Q1 or Q2 will be caused to draw more (or less) current from common current source BIAS to flow through a conduction path including that transistor. The different amounts of current drawn in each conduction path causes a voltage differential between output nodes OUT+ and OUT− due to the different voltage drops between the identical resistances RL in the different conduction paths including Q1 and Q2.

The open-loop gain $A_v$ is determined in accordance with IBIAS×RL and needs to be high to allow the feedback to work properly through feedback resistors RFB so that the closed-loop gain of the circuit can be set predominantly by the values of RFB, as it should be. By increasing the resistance of RL, one can increase the gain $A_v$ towards the desired amount. (It should be noted that this can also be done by increasing the bias current IBIAS, but this alternative is not preferred because it leads to increased power consumption.) However, as RL is increased, the voltage drop between the collector of transistors Q1 and Q2 and the voltage source Vdd increases, causing the voltage at the collector of transistors Q1 and Q2 to fall closer to the voltage at the base, and causing Q1 and Q2 to go into saturation and lose their current gain. Accordingly, RL (and hence, the gain $A_v$) must be limited to permit Q1 and Q2 to remain optimally operational.

One conventional way to address this problem, as well as the saturation problem referred to above, is to clamp the outputs OUT+ and OUT−. This conventional approach is illustrated in FIG. 2B. As shown in FIG. 2B, differential feedback amplifier 102 further includes clamping diodes D1 and D2 arranged in a symmetrical back-to-back configuration between nodes OUT+ and OUT−. Such an arrangement insures that the differential voltage between OUT+ and OUT− (and hence the maximum offset from a common mode voltage at either node) will never exceed the differential amount of voltage across D1 and D2 required to make either conduct, without having to reduce RL (and hence, the gain $A_v$).

The conventional approach described above has drawbacks, however. For example, in many processes, the voltage differential between nodes OUT+ and OUT− must be at least 600–700 mV for the diodes to have any effect. However, many small signal applications (e.g. LVDS or CML) usually only have a differential of about 350 mV. Accordingly, most conventional diodes are useless in such applications. Although Schottky diodes require only about a 200–400 mV differential to be useful, they are difficult to implement in many processes because of yield and cost issues and therefore fail to provide an effective solution to the conventional approach.

SUMMARY OF THE INVENTION

The present invention relates to data signaling apparatuses and methods. According to one aspect of the invention, a data signaling apparatus includes a differential amplifier for providing an amplified differential output on a pair of outputs in response to a differential signal provided on a pair of inputs, and a clamping resistor between the pair of inputs. The clamping resistor acts to effectively reduce the swing in differential inputs, thereby allowing a reasonably high gain that does not result in problematic differential outputs. Further, since the resistor is operative for all voltage ranges, it is useful in small signal applications where diodes cannot be used or are too difficult to implement. The invention is particularly useful in high-gain limiting amplifiers for high-speed applications in excess of 1 Gbps. According to another aspect of the invention, a data signaling method includes receiving a differential signal on a pair of inputs, reducing the magnitude of the differential signal by a scale factor using a clamping resistor across the pair of inputs, and providing an amplified differential output on a pair of outputs in response to the scaled differential signal provided on the pair of inputs.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the known components referred to herein by way of illustration.

Figure 3:
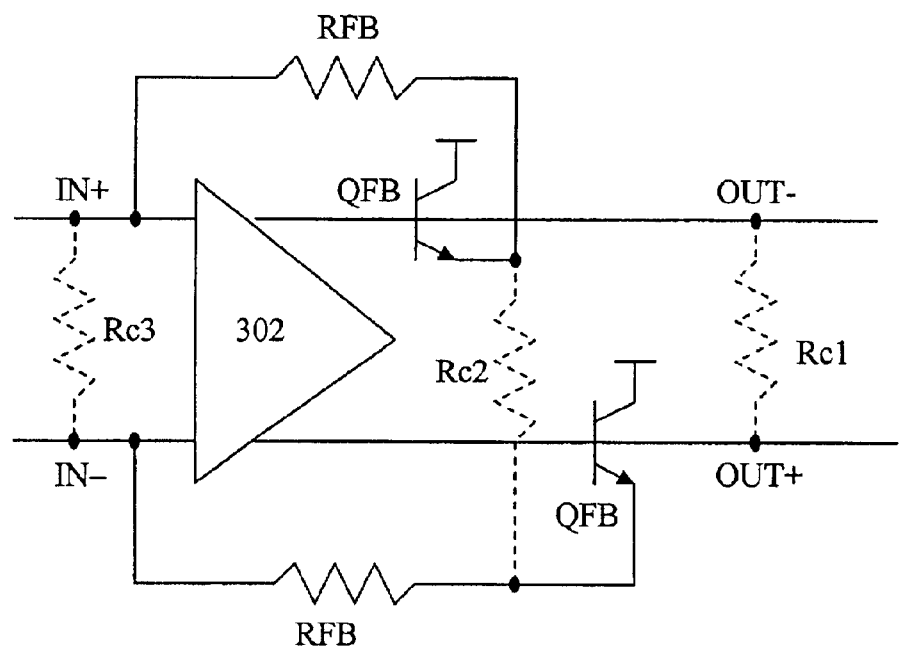
FIG. 3 is a functional block diagram illustrating possible approaches for providing a differential feedback amplifier in accordance with the principles of the invention.

FIG. 3 is a functional block diagram illustrating possible approaches in accordance with the principles of the invention for solving the problems in the prior art using resistors to perform clamping rather than diodes. A differential amplifier 302 shown in FIG. 3 provides an amplified output on a pair of output nodes OUT+ and OUT− in accordance with a differential signal received on a pair of input nodes IN+ and IN−. Differential amplifier 302 further includes buffer transistors QFB and feedback resistors RFB provided between the respective outputs and inputs OUT−/IN+ and OUT+/IN−. Transistors QFB in each feedback path are provided to isolate the feedback loads from the sensitive output nodes OUT+ and OUT−and to provide DC level-shifting for proper biasing of the circuit.

As shown in FIG. 3, one possible approach is to couple a resistor Rc1 between the output nodes OUT+ and OUT−. This resistor will thus consume some of the current IBIAS, thereby reducing the differential voltage between the output nodes and increasing the absolute minimum voltages at the nodes. Unlike the diode solution, the resistor will be effective at all ranges of differential voltages between OUT+ and OUT−. However, this resistor will also have the effect of reducing the gain $A_v$ of the circuit.

As further shown in FIG. 3, another possible approach is to couple a resistor Rc2 between the feedback resistors RFB. However, this configuration has the same effect of reducing the gain of the circuit as the previous approach.

Another possible approach as shown in FIG. 3 involves coupling a resistor Rc3 between the input nodes IN+ and IN−. Like the above approaches, the resistor is useful in all ranges of differential voltages unlike diodes. A further advantage of this approach can be illustrated in the following equations. For a given amplifier having a gain $A_v$, it should be apparent that:

$$Vout = A_v \times Vin \quad (Eq.1)$$

Accordingly, it follows that:

$$\Delta Vout = A_v \times \Delta Vin \quad (Eq.2)$$

where ΔVout is the difference in voltage at the output nodes OUT+ and OUT−for a given difference in voltage ΔVin at the input nodes IN+ and IN−. Since it is desired that $A_v$ be as high as possible while keeping the differential voltages at the output nodes from becoming too high, one efficient way to address these dual concerns is to reduce ΔVin.

Resistor Rc3 coupled between input nodes IN+ and IN− has the effect of reducing the difference ΔVin between the input nodes, thus allowing the gain to be increased as desired without increasing ΔVout to the point of saturating the subsequent stages. Because the resistor will draw current in linear proportion to the values of ΔVin, it acts to scale ΔVin by a constant scale factor.

Figure 4:
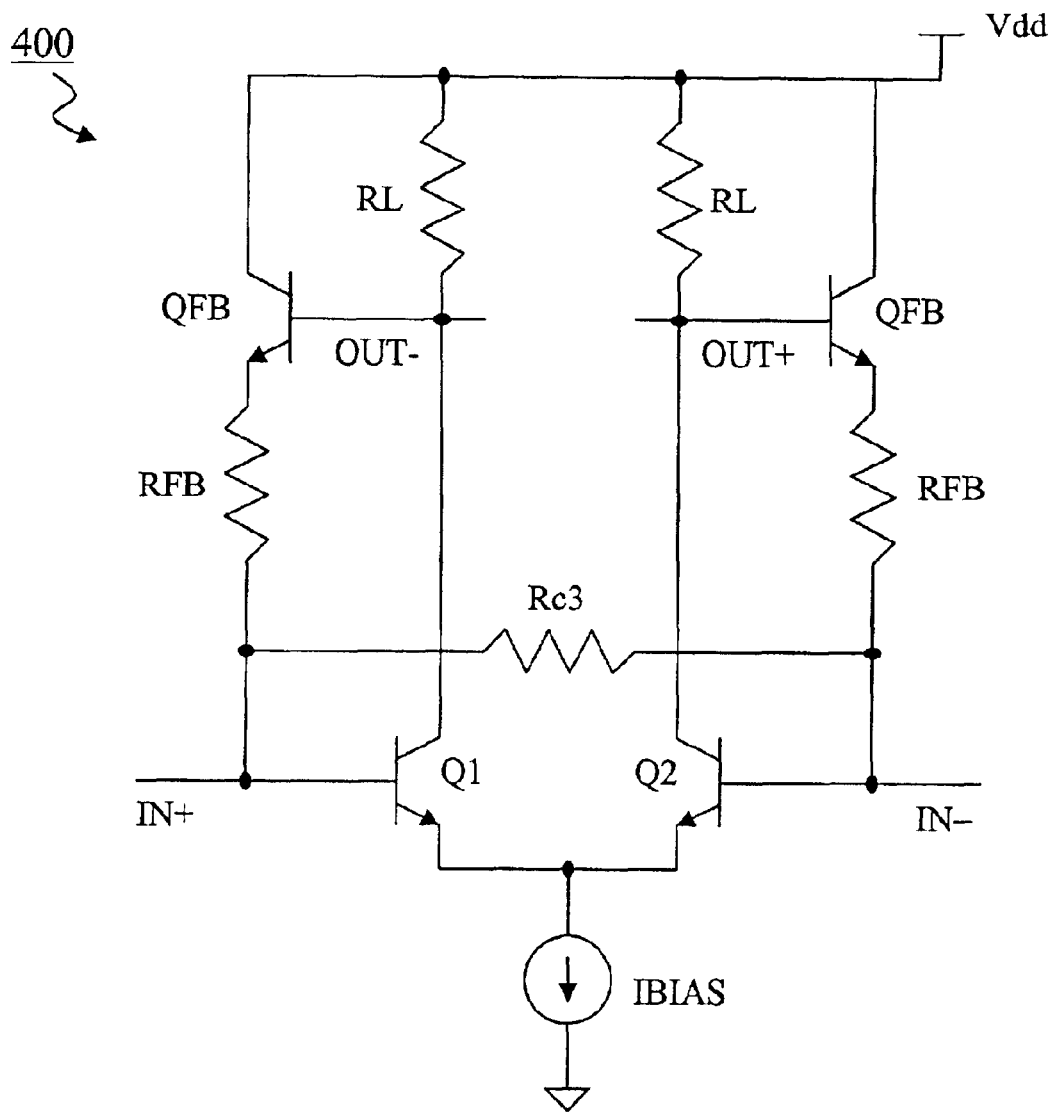
FIG. 4 is a circuit diagram illustrating an example implementation of a differential feedback amplifier in accordance with the principles of the invention.

FIG. 4 illustrates an example implementation of the third approach illustrated in FIG. 3. As shown in FIG. 4, differential feedback amplifier circuit 400 in accordance with the invention includes transistor Q1 receiving one end of a differential input signal coupled to node IN+ at its base, with its emitter coupled to current source IBIAS and its collector coupled to output node OUT−. Similarly, transistor Q2 receives the other end of a differential input signal coupled to node IN− at its base, with its emitter coupled to current source BIAS commonly with the emitter of Q1, and its collector coupled to output node OUT+. Output nodes OUT+ and OUT− are both commonly connected to voltage source Vdd through respective resistors RL. Output nodes OUT+ and OUT−are also coupled to one end of respective feedback resistors RFB via respective buffer transistors QFB. The other ends of feedback resistors RFB are respectively coupled back to input nodes IN− and IN+.

In accordance with an aspect of the invention, amplifier 400 further includes clamping resistor Rc3 coupled between input nodes IN+ and IN−. It should be apparent that when the magnitudes of the input signals applied to the input nodes are the same (i.e. ΔVin=0), resistor Rc3 will have no effect. However, Rc3 will begin to draw current as a differential voltage appears across the input nodes in accordance with a division between Rc3, the input impedance of the differential amplifier 400, and the source impedances at input nodes IN+ and IN−. Since the values of Rc3, the input impedance of amplifier 400 and the source impedances at IN+ and IN− will remain constant, this division will remain constant, and so Rc3 acts to scale the differential input ΔVin by a constant scale factor.

In one example implementation of amplifier 400, where the input signal range ΔVin is about +/−100 mV, Vdd is 3.3V, IBIAS is 2mA, RL is 115 ohms, and RFB is 290 ohms. The value of resistor Rc3 in such an implementation is, for example, about 500 ohms. The value of Rc3 can be large compared to RL, RFB and other impedances mentioned above, to minimize its effect on gain reduction, since only a small change in ΔVin is needed to cause a large change in ΔVout, thus effectively implementing the clamping function on ΔVout.

Figure 1:
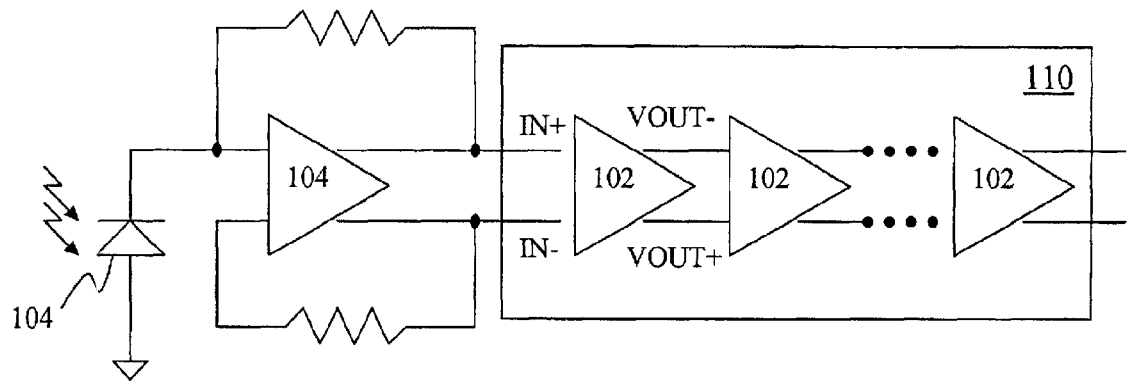
FIG. 1 illustrates an example application of a conventional differential feedback amplifier as a limiting amplifier in an optical receiver.
Figure 2A:
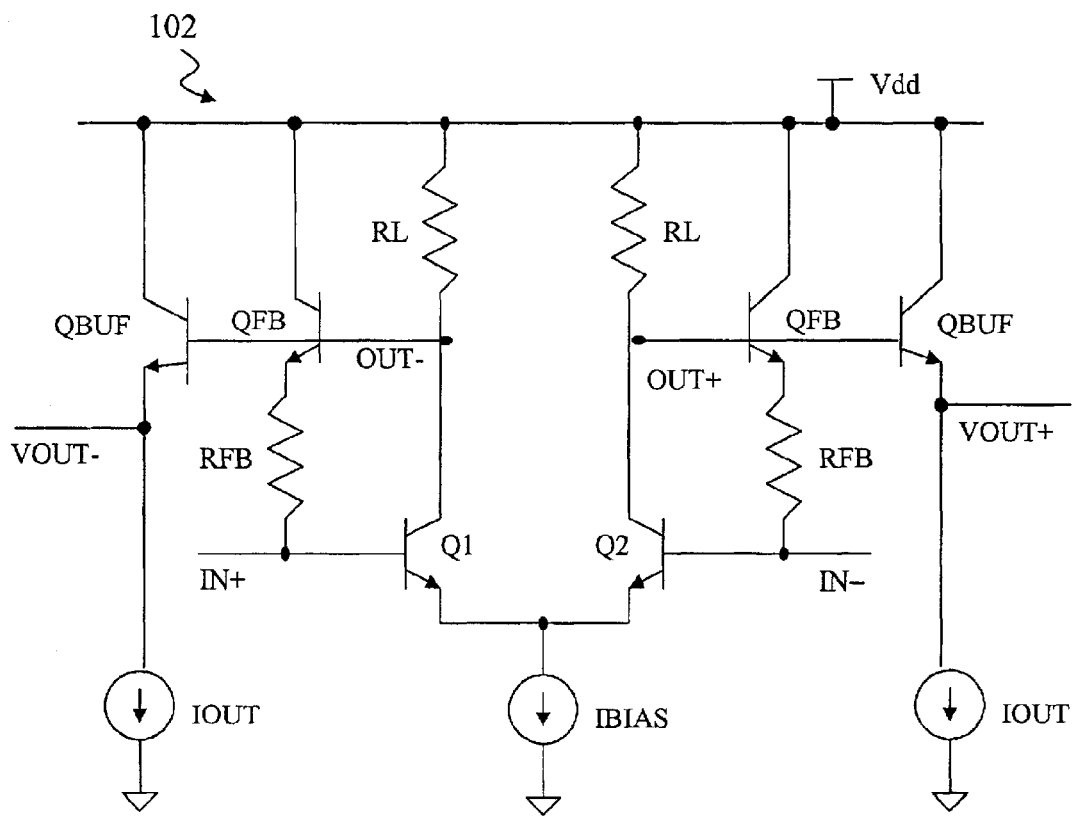
FIGS. 2A and 2B are circuit diagrams illustrating example implementations of a conventional differential feedback amplifier.
Figure 2B:
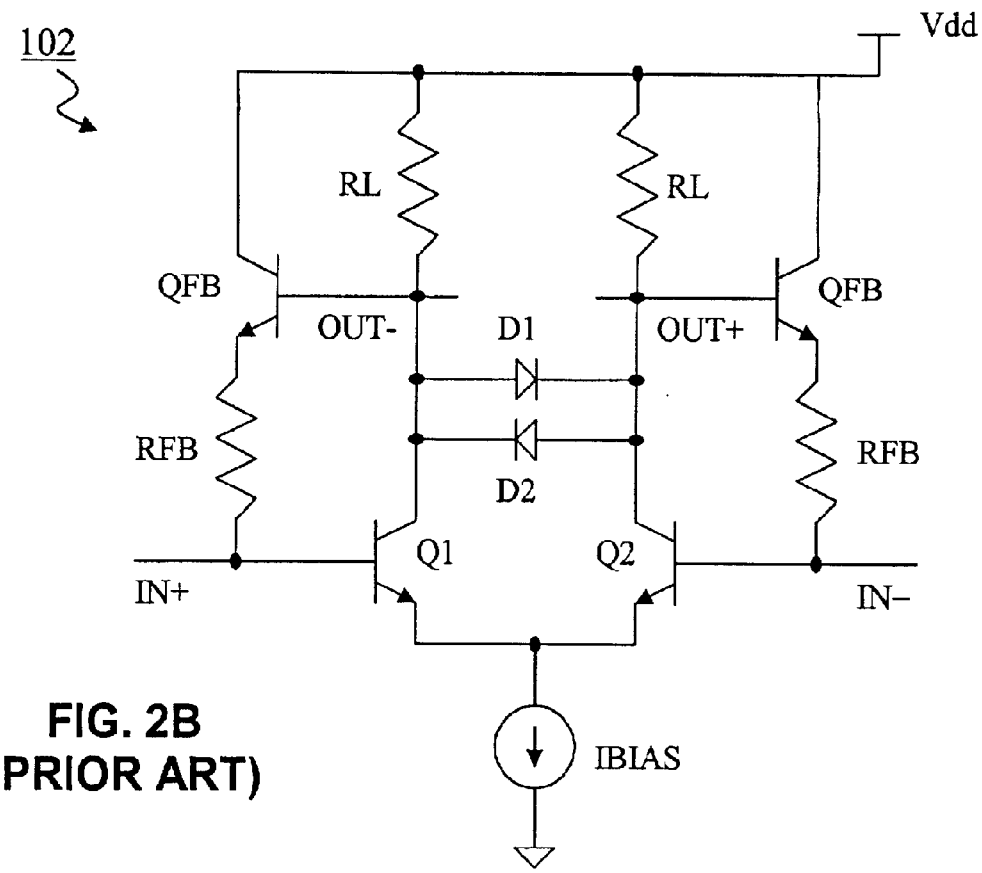

In operation, as described above in connection with FIG. 2A, in accordance with a difference between inputs IN+ or IN−, either Q1 or Q2 will be caused to draw more (or less) current from common current source IBIAS to flow through a conduction path including that transistor. The different amounts of current drawn in each conduction path causes a voltage differential between output nodes OUT+ and OUT− due to the different voltage drops from Vdd between the identical resistances RL in the different conduction paths including Q1 and Q2. The amplified differential between output nodes OUT+ and OUT− from the input differential at input nodes IN+ and IN− will be provided by operation of transistors Q1 and Q2 in proportion to the resistance RL. However, differently from the operation of the circuit in FIG. 2A, as the input signals attempt to establish more of a difference across input nodes IN+ and IN−, current will be drawn by resistor Rc3 from resistors RFB to counteract this increase in voltage difference across IN+ and IN−, effectively clamping ΔVin to a relatively low value. This allows a relatively high value of $A_v$ without causing saturation problems for Q1 and Q2, since the differential signal across the output nodes OUT+ and OUT− is already limited by the limited range imposed on the differential signal across IN+ and IN− by Rc3.

In addition to the advantages discussed above, the implementation depicted in FIG. 4 provides the following advantages. For example, the value of Rc3 can be relatively high to minimize reductions in closed-loop gain, feedback amount and circuit bandwidth, compared to the alternative configurations.

Figure 5:
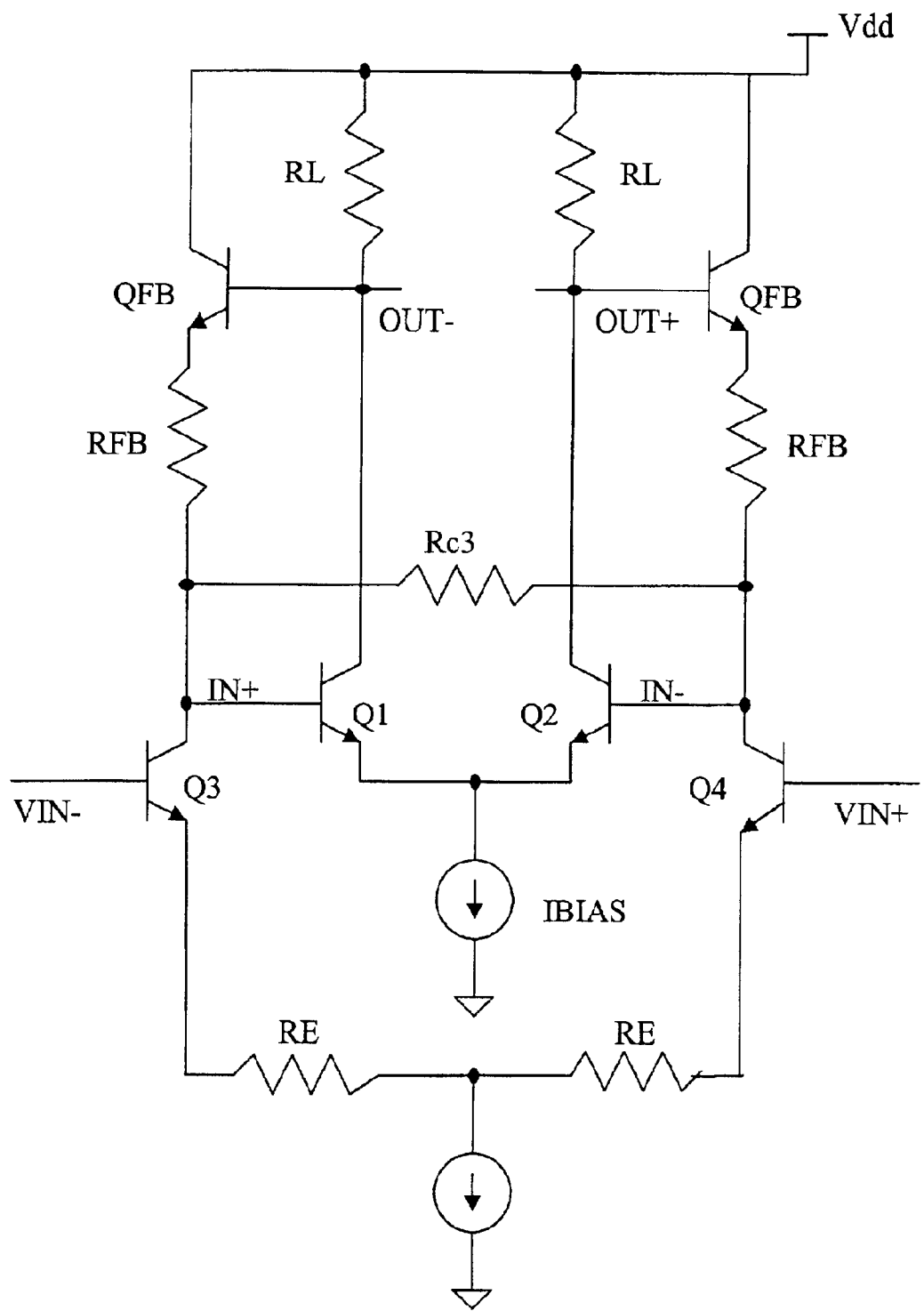
FIG. 5 is a circuit diagram illustrating another example implementation of a differential feedback amplifier in accordance with the principles of the invention.

Another possible implementation of a differential feedback amplifier circuit in accordance with the invention is shown in FIG. 5, wherein differential signal currents are provided to IN+ and IN− by a differential pair of transistors Q3 and Q4 whose inputs are connected to VIN− and VIN+, respectively. The resistors RE serve to widen the linear range of differential voltage inputs VIN+ and VIN− and may or may not be needed. Rc3 is still used to limit the range of IN+ and IN− and thereby to limit the range of OUT+ and OUT−.

Although the present invention has been described hereinabove with respect to an example application where the feedback amplifier receives differential signal inputs, the invention is not so limited. For example, the principles of the invention can be extended to differential feedback amplifiers having a single-ended input by floating the other input and providing a DC-offset cancellation mechanism to it.

Further, although the present invention has been particularly described with reference to the preferred embodiments thereof, it should be readily apparent to those of ordinary skill in the art that changes and modifications in the form and details may be made without departing from the spirit and scope of the invention. It is intended that the appended claims include such changes and modifications.

What is claimed is:

1. A data signaling apparatus, comprising:
    first and second input nodes for receiving an input differential data signal;
    first and second output nodes;
    a differential amplifier coupled to the input nodes and the output nodes that provides an amplified differential data signal on the output nodes in response to the received input differential data signal, the differential amplifier including:
        a first feedback resistor coupled between the first input node and the first output node,
        a second feedback resistor coupled between the second input node and the second output node,
        a first conduction path coupled to the first output node and controlled by a first transistor coupled to the first input node, and
        a second conduction path coupled to the second output node and controlled by a second transistor coupled to the second output node,
        wherein the amplified differential data signal is established between the output nodes in accordance with a relative current flowing in the first and second conduction paths based on the received input differential data signal established between the input nodes; and
    a clamping resistor coupled between the input nodes and in a current path with the first and second feedback resistors.

2. A data signaling apparatus according to claim 1, wherein the differential amplifier further includes first and second load resistances in the first and second conduction paths, respectively, the amplified differential data signal being determined in accordance with first and second voltage drops across the first and second load resistances, respectively, created by the relative amount of current.

3. A data signaling apparatus according to claims 2, wherein a gain between the input differential data signal and the amplified differential data signal is proportional to the first and second load resistances.

4. A data signaling apparatus according to claim 1, wherein the input differential data signal is a high-speed signal in excess of 1 Gbps.

5. A data signaling apparatus according to claim 4, wherein the amplified differential data signal is useful with one of a LVDS and a CML data signaling standard.

6. A data signaling apparatus according to claim 4, wherein the differential amplifier is a limiting amplifier.

7. A data signaling apparatus, comprising:
    input means for receiving an input differential data signal;
    amplifier means for producing an amplified differential data signal in response to the received input differential data signal, the amplifier means including:
        resistance means coupled to the input means for providing feedback corresponding to the amplified differential data signal,
        first conduction means for providing a first portion of the amplified differential data signal,
        first transistor means for controlling the first conduction means in accordance with the received input differential data signal,
        second conduction means for providing a second portion of the amplified differential data signal,
        second transistor means for controlling the second conduction means in accordance with the received input differential data signal,
        wherein the amplified differential data signal is established as a difference between the first and second portions; and
    clamping means coupled to the input means and resistance means for providing a current path with the resistance means in accordance with the received input differential data signal.

8. A data signaling apparatus according to claim 7, wherein the first and second conduction means include first and second load resistance means, respectively, the amplified differential data signal being determined in accordance with first and second voltage drops across the first and second resistance means, respectively.

9. A data signaling apparatus according to claim 8, wherein a gain between the input differential data signal and the amplified differential data signal is proportional to values of the first and second load resistance means.

10. A data signaling apparatus according to claim 7, wherein the input differential data signal is a high-speed signal in excess of 1 Gbps.

11. A data signaling apparatus according to claim 10, wherein the amplified differential data signal is useful with one of a LVDS and a CML data signaling standard.

12. A data signaling method, comprising:
receiving an input differential data signal;
producing an amplified differential data signal in response to the received input differential data signal, the producing step including:
providing feedback corresponding to the amplified differential data signal, establishing a first conduction path for providing a first portion of the amplified differential data signal,
controlling the first conduction path in accordance with the received input differential data signal,
establishing a second conduction path for providing a second Portion of the amplified differential data signal,
controlling the second conduction path in accordance with the received input differential data signal,
wherein the amplified differential data signal is established as a difference between the first and second portions; and
providing a current path with the feedback in accordance with the received input differential data signal.

13. A data signaling method according to claim 12, wherein the first and second conduction paths include first and second resistances, respectively, the amplified differential data signal being determined in accordance with first and second voltage drops across the first and second resistances, respectively, created by a relative amount of current in the first and second conduction paths.

14. A data signaling method according to claim 13, wherein a gain between the input differential data signal and the amplified differential data signal is proportional to values of the first and second resistances.

15. A data signaling method according to claim 12, wherein the input differential data signal is a high-speed signal in excess of 1 Gbps.

16. A data signaling method according to claim 15, wherein the amplified differential data signal is useful with one of a LVDS and a CML data signaling standard.

17. A method of increasing gain in a data signaling apparatus, comprising:
preparing an amplifier having first and second input nodes for receiving an input differential data signal, the amplifier producing an amplified differential data signal at first and second output nodes in accordance with the received input differential data signal, the amplifier including:
a first feedback resistor coupled between the first input node and the first output node,
a second feedback resistor coupled between the second input node and the second output node,
a first conduction path coupled to the first output node and controlled by a first transistor coupled to the first input node, and
a second conduction path coupled to the second output node and controlled by a second transistor coupled to the second output node,
wherein the amplified differential data signal is established between the output nodes in accordance with a relative current flowing in the first and second conduction paths based on the received input differential data signal established between the input nodes
identifying an open-loop feedback gain of the amplifier;
coupling a clamping resistor between the input nodes; and
increasing the identified open-loop feedback rain of the amplifier in accordance with the clamping resistor.

18. A method according to claim 17, wherein the input differential data signal is a high-speed signal in excess of 1 Gbps.

19. A method according to claim 18, wherein the amplified differential data signal is useful with one of a LVDS and a CML data signaling standard.

20. A method according to claim 18, wherein the amplifier is a limiting amplifier.

21. A data signaling apparatus according to claim 1, further comprising:
first and second differential transistors coupled to the input nodes, respectively, for providing the input differential data signal as differential signal currents to the input nodes in accordance with a differential voltage established between the bases of the first and second differential transistors.

22. A data signaling apparatus according to claim 9, further comprising:
differential transistor means coupled to the input means for providing the input differential data signal as differential signal currents to the input means in accordance with a differential voltage established at an input to the differential transistor means.

23. A data signaling method according to claim 12, further comprising:
providing the input differential data signal as differential signal currents in accordance with a received differential voltage.

\* \* \* \* \*